United States Patent [19]  
West et al.

[11] Patent Number: 4,501,976  
[45] Date of Patent: Feb. 26, 1985

[54] TRANSISTOR-TRANSISTOR LOGIC CIRCUIT WITH HYSTERESIS

[75] Inventors: Jeffery A. West, Pleasant Grove; Thomas D. Fletcher, Provo, both of Utah

[73] Assignee: Signetics Corporation, Sunnyvale, Calif.

[21] Appl. No.: 415,109

[22] Filed: Sep. 6, 1982

[51] Int. Cl.³ .................. H03K 19/003; H03K 19/088; H03K 19/20
[52] U.S. Cl. .................................... 307/456; 307/360; 307/443; 307/458; 307/264
[58] Field of Search ............... 307/443, 264, 456–458, 307/354, 360, 290, 270

[56] References Cited

U.S. PATENT DOCUMENTS

| 3,510,685 | 5/1970 | Watanabe et al. | 307/457 X |
| 3,544,808 | 12/1970 | Mukai | 307/457 X |
| 3,676,713 | 7/1972 | Wiedmann | 307/456 |
| 3,836,792 | 9/1974 | Eckert, Jr. et al. | 307/456 |
| 3,934,157 | 1/1976 | Evans | 307/299 A X |
| 4,375,598 | 3/1983 | Sakai | 307/290 X |

FOREIGN PATENT DOCUMENTS 54-134548 10/1979 Japan ..................... 307/456

OTHER PUBLICATIONS

"Transistor-Transistor Logic with High Packing Density and Optimum Performance at High Inverse Gain," 1968, *ISSCC Dig. of Tech. Paps.*, Feb. 15, 1968, pp. 38–39.
Montegari, "Universal Latch", IBM Tech. Disc. Bull., vol. 19, No. 10, Mar. 1977, pp. 3743–3744.

*Primary Examiner*—Stanley D. Miller
*Assistant Examiner*—David R. Hudspeth
*Attorney, Agent, or Firm*—R. J. Meetin; R. T. Mayer; T. A. Briody

[57] ABSTRACT

A TTL circuit having a pair of current sources ($R2/V_{CC}$ and $R2/V_{CC}$) and a pair of transistors (Q1 and Q2) arranged in a standard TTL input/inverting configuration has hysteresis at the input signal ($V_X$) for providing noise protection. A hysteresis circuit (10) suitably containing another current source ($R3/V_{CC}$) coupled to the base of the inverting transistor (Q2) and a rectifier (12) coupled between the collector of the inverting transistor and the current source ($R1/V_{CC}$) coupled to the base of the input transistor (Q1) provides the hysteresis at the circuit switching points.

12 Claims, 5 Drawing Figures

TRANSISTOR-TRANSISTOR LOGIC CIRCUIT WITH HYSTERESIS

FIELD OF USE

This invention relates to transistor-transistor logic (TTL) circuits suitable for use in semiconductor devices.

BACKGROUND ART

TTL circuits are derived from a common NAND logic structure of which FIG. 1 shows a conventional arrangement of the input/inverting section. In this partial TTL circuit, N logical input voltage signals $V_{X1}$, $V_{X2}$, ... and $V_{XN}$ are provided respectively to N emitters of a multiple-emitter NPN transistor Q1 whose collector is connected to the base of a phase-splitting NPN transistor Q2. Its emitter is at a control voltage $V_E$, while its collector provides a logical voltage signal $V_Y$. The base of transistor Q1 is connected to a current source consisting of a resistor R1 connected to a source of a supply voltage $V_{CC}$. The collector of transistor Q2 is connected to another current source consisting of a resistor R2 connected to the $V_{CC}$ supply.

The basic inverting operation of the TTL circuit of FIG. 1 can be understood by first assuming that all but one of input voltages $V_{X1}-V_{XN}$ are at a nominal high value $V_1$ at logical "1" (hereafter usually just "1"). For example, let each of voltages $V_{X2}-V_{XN}$ be held at $V_1$. Equivalently, the associated (N−1) emitters of transistor Q1 are open and thus essentially nonexistent so that transistor Q1 acts as a single-emitter transistor controlled by voltage $V_{X1}$.

Next, assume that voltage $V_{X1}$ is initially at a nominal low value $V_0$ at logical "0" (hereafter usually just "0") which is sufficiently low that transistor Q1 is turned on (fully conductive). Current from the R1 current source flows into the base of transistor Q1 and out through its emitter controlled by voltage $V_{X1}$. The voltage between the base and emitter of transistor Q1 is $1V_{BE}$, where $V_{BE}$ is the standard base-to-emitter voltage for an NPN transistor when its base-emitter junction is just conductively forward biased. The collector of transistor Q1 conducts substantially no current since transistor Q2 does not act as a current supply for transistor Q1. Nonetheless, transistor Q1 is saturated. Its collector-to-emitter voltage is $V_{SAT1}$ which is near 0 volt. Transistor Q2 is turned off (non-conductive). Its base-to-emitter voltage is less than $1V_{BE}$. Voltage $V_Y$ is at a "1" level near $V_{CC}$.

Voltage $V_{X1}$ is now raised, causing the base and collector voltages for transistor Q1 to increase so as to keep it conductive with its collector-to-emitter voltage at $V_{SAT1}$. Voltage $V_E$ normally rises also. The base voltage for transistor Q2 likewise increases until its base-to-emitter voltage reaches $1V_{BE}$. At this point, the base-collector junction of transistor Q1 becomes conductively forward biased and transmits current from the R1 source to the base of transistor Q2 to turn it on and cause it to saturate. Voltage $V_E$ reaches an upper limit $V_{EM}$ and normally stays there while transistor Q2 is on. Transistor Q1 turns off as its base-to-emitter voltage drops below $1V_{BE}$. Accordingly, the threshold value $V_{TR}$ of voltage $V_{X1}$ at which transistor Q2 turns on is $V_{EM}+V_{BE}-V_{SAT1}$. Since transistor Q2 is saturated, its collector-to-emitter voltage is $V_{SAT2}$ which is near 0 volt. Voltage $V_Y$ drops to a "0" level at $V_{EM}+V_{SAT2}$. Voltage $V_{X1}$ continues to rise up to $V_1$.

Substantially the opposite occurs when voltage $V_{X1}$ is brought back down to $V_0$. As voltage $V_{X1}$ drops to $V_{EM}+V_{BE}-V_{SAT1}$, transistor Q2 turns off, and transistor Q1 turns on. Consequently, the threshold voltage $V_{TF}$ at which transistor Q2 turns off equals $V_{TR}$. Voltage $V_Y$ returns to its "1" level. The high-level falling input noise margin $V_1-V_{TF}$ therefore equals the high-level rising input noise margin $V_1-V_{TR}$. Likewise, the low-level input noise margins $V_{TF}-V_0$ and $V_{TR}-V_0$ are the same.

A disadvantage of the foregoing circuit is that noise in input voltage $V_{X1}$ can occasionally cause the circuit to switch state more than once during a slow transition in voltage $V_{X1}$. For example, noise during a slow rise in voltage $V_{X1}$ could cause transistor Q2 to turn on, off, and then on again. This can largely be avoided by including hysteresis in the circuit at the switching points so that voltage $V_{TR}$ exceeds voltage $V_{TF}$ by more than the typical amount of noise in voltage $V_{X1}$. Moreover, such hysteresis improves the input noise margins since the high-level falling input noise margin then exceeds the high-level rising input noise margin, while the complement of this is true for the low-level input noise margins. When voltage $V_{X1}$ is at $V_1$, an unintentional transient $V_{X1}$ drop below $V_{TR}$ would not cause transistor Q2 to switch off unless voltage $V_{X1}$ also drops below $V_{TF}$. Similarly, a transient increase in voltage $V_{X1}$ from $V_0$ to $V_{TF}$ would not cause the circuit to switch unless voltage $V_{X1}$ also rises above $V_{TR}$. In short, use of such hysteresis in the TTL circuit shown in FIG. 1 would provide additional noise immunity.

B. T. Murphy et al disclose such a TTL circuit with hysteresis in "Transistor-Transistor Logic with High Packing Density and Optimum Performance at High Inverse Gain," 1968 *ISSCC Dig. of Tech. Paps.*, Feb. 15, 1968, pp. 38-39. In this circuit, transistor Q2 is formed with an additional emitter to achieve hysteresis. This additional emitter is connected to a resistive voltage divider connected between the base and collector of transistor Q1. Even though this circuit can be implemented easily, there may be manufacturing difficulty in the control of the emitter-to-emitter gain.

The switching speed of the basic TTL circuit of FIG. 1 can be improved by utilizing appropriate clamping circuitry to keep transistor Q2 out of saturation. H. Enomoto discloses such a clamped TTL circuit in "Logical Operation Circuit", Japanese patent publication Kokai No. 54-134548, Oct. 19, 1979. In this circuit, a Schottky diode arranged in an opposing configuration to the base-emitter junction of transistor Q1 is connected between the base of transistor Q1 and the collector of transistor Q2 so as to prevent it from going into deep saturation. This circuit, however, does not contain hysteresis for providing additional noise immunity.

DISCLOSURE OF THE INVENTION

A TTL circuit in accordance with the invention contains hysteresis for providing noise protection. The circuit has a pair of like-polarity bipolar transistors designated as the first and second transistors. An input signal is provided to the emitter of the first transistor whose base is coupled to a first current source in the circuit. The collector of the first transistor is coupled to the base of the second transistor whose emitter is at a control voltage and whose collector is coupled to a second current source in the circuit. The second transistor turns on as the input signal moves in one voltage rise/fall direction to a first threshold voltage. A hysteresis circuit coupled to the base of the second transistor and coupled between its collector and the first current source causes the second transistor to turn off as the input signal moves in the opposite voltage rise/fall direction to a second threshold voltage which differs from the first threshold voltage. In particular, the absolute value of the difference between the first threshold voltage and the control voltage as the second transistor turns on exceeds the absolute value of the difference between the second threshold voltage and the control voltage as the second transistor turns off.

The hysteresis circuit contains a rectifier and a third current source. The rectifier is arranged in an opposing configuration to the base-emitter junction of the first transistor in such a manner as to transmit current in a single current-flow direction between the first current source and the collector of the second transistor. The voltage drop across the rectifier when it is just conductively forward biased normally lies between $0V_{BE}$ and $2V_{BE}$. The third current source supplies current to the base of the second transistor. As with the first and second current sources, the third current source preferably consists of a resistor coupled to a power supply.

The circuit is conveniently implemented using NPN devices for the transistors and a Schottky diode for the rectifier. In this case, the resulting additional noise immunity is about 0.4–0.8 volt depending on whether the first and second transistors are Schottky clamped and is typically 0.5 volt with Schottky clamping. During a slow input transition with no more than 0.5 volt of noise in the input signal, the circuit switches only once. The input noise margins are also improved in the manner described above. These advantages are achieved without introducing any significant manufacturing difficulties in controlling design parameters in the present TTL circuit.

Figure 1:
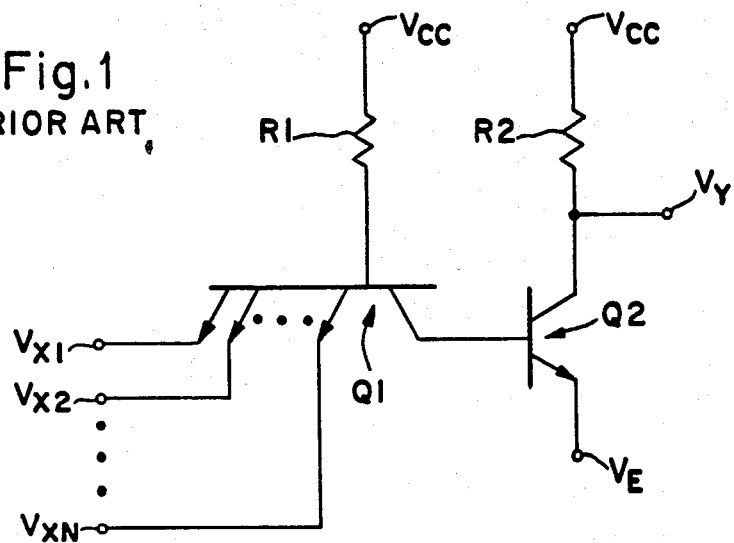
FIG. 1 is a circuit diagram of the input/inverting section of a prior art TTL NAND gate.

Each Schottky diode whose anode is connected to the base of an NPN transistor and whose cathode is connected to the collector of the transistor so as to clamp it out of deep saturation is not shown in the drawings. Instead, the base of each such Schottky-clamped NPN transistor is illustrated as a long block "S" to represent the clamping Schottky diode.

Like reference symbols are employed in the drawings and in the description of the preferred embodiments to represent the same or very similar item or items.

DESCRIPTION OF THE PREFERRED EMBODIMENTS

Figure 2:
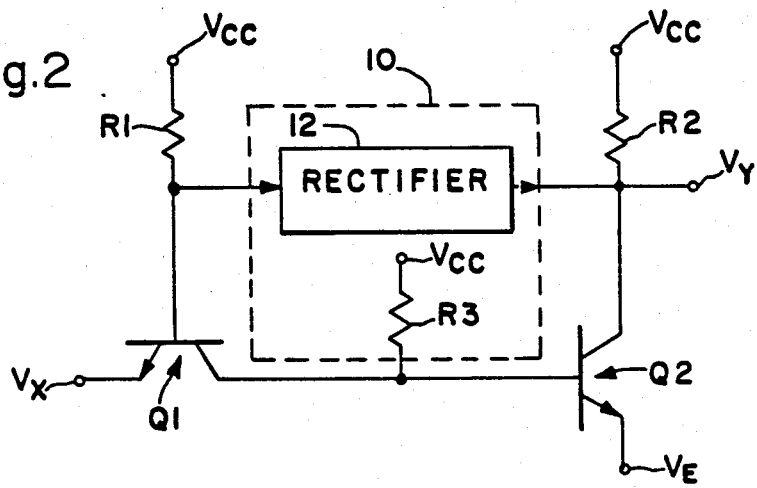
FIG. 2 is a circuit diagram of a TTL circuit having hysteresis according to the invention.

Referring to the drawings, FIG. 2 illustrates a TTL circuit having hysteresis for providing noise protection. This TTL circuit, which is typically used in the input/inverting section of a TTL gate, converts a logical input voltage signal $V_X$ applied to the single emitter of NPN input transistor Q1 into logical voltage signal $V_Y$ taken from the collector of NPN inverting transistor Q2 whose base is connected to the collector of transistor Q1. Voltage $V_Y$ is logically inverted with respect to voltage $V_X$. As in the prior art circuit of FIG. 1, the emitter of transistor Q2 is at control voltage $V_E$ which equals $V_{EM}$ when transistor Q2 is conductive. Likewise, the R1 current source provides the base current for transistor Q1, while the R2 current source supplies current to the collector of transistor Q2.

A hysteresis circuit 10 causes the threshold value $V_{TR}$ of voltage $V_X$ at which transistor Q2 turns on when voltage $V_X$ is rising to be greater than the threshold value $V_{TF}$ of voltage $V_X$ when transistor Q2 turns off as voltage $V_X$ is falling. Hysteresis circuit 10 consists of a rectifier 12 and a current source connected to the base of transistor Q2. This current source consists of a resistor R3 connected to the VCC supply. Rectifier 12 is arranged in an opposing configuration to the base-emitter junction of transistor Q1 so as to permit (positive) current to flow only from the R1 source to the collector of transistor Q2 when rectifier 12 is conductive. The voltage drop $V_D$ across rectifier 12 when it just becomes conductive lies between $0V_{BE}$ and $2V_{BE}-V_{SAT1}-V_{SAT2}$. If $V_{SAT1}$ and $V_{SAT2}$ are each near 0 volt, the upper limit for drop $V_D$ is $2V_{BE}$. This range for drop $V_D$ is achieved by using a single diode or a set of serially-connected diodes to form rectifier 12. Preferably, voltage drop $V_D$ is as near $0V_{BE}$ as possible. This is accomplished by embodying rectifier 12 as a Schottky diode.

Figure 3:
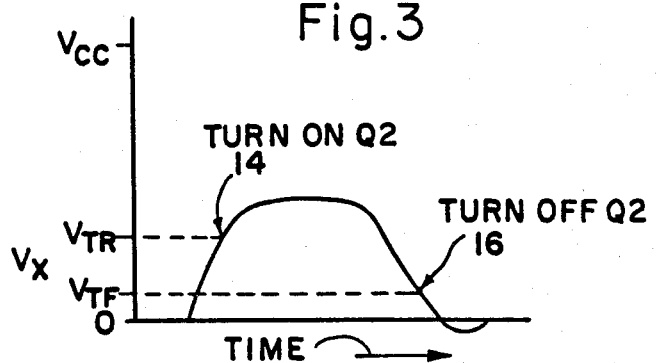
FIG. 3 is a waveform diagram illustrating the performance of the circuit of FIG. 2.

Understanding the operation of the TTL circuit of FIG. 2 is facilitated with the aid of FIG. 3 which shows changes in the circuit as voltage $V_X$ varies with time. Assume that voltage $V_X$ is initially at low value $V_0$ which is less than $V_{EM}+V_{BE}-V_{SAT1}$. As with the circuit of FIG. 1, transistor Q1 is turned on with its base-to-emitter voltage at $1V_{BE}$ as the R1 source provides current to its base. Its base voltage is therefore less than $V_{EM}+2V_{BE}-V_{SAT1}$ which is chosen to be less than $V_{CC}$. Transistor Q2 is off so that voltage $V_Y$ is at its "1" level near $V_{CC}$. Consequently, rectifier 12 is reverse biased and non-conductive. The R3 source does provide current to transistor Q1. This is not particularly significant because transistor Q1 is saturated with its collector-to-emitter voltage at $V_{SAT1}$.

As with FIG. 1, the base-to-emitter voltage for transistor Q2 reaches $1V_{BE}$ when voltage $V_X$ reaches $V_{EM}+V_{BE}-V_{SAT1}$ while being raised. The R3 current source now begins supplying current to the base of transistor Q2. It turns on as shown at point 14 in FIG. 3. Accordingly, the threshold value $V_{TR}$ of voltage $V_X$ when it is rising at which transistor Q2 turns on is again $V_{EM}+V_{BE}-V_{SAT1}$.

Just before transistor Q2 turns on, the base voltage for transistor Q2 is just under $V_{EM}+2V_{BE}-V_{SAT1}$. As transistor Q2 turns on, voltage $V_Y$ drops to $V_{EM}+V_{SAT2}$. Consequently, the voltage drop across rectifier 12 is momentarily greater than its conductive drop $V_D$ which is less than $2V_{BE}-V_{SAT1}-V_{SAT2}$. This forces recitfier 12 to turn on and transmit current from the R1 current source to the collector of transistor Q2. The voltage drop across rectifier 12 then rapidly drops to $V_D$, causing the base voltage for transistor Q1 to drop to $V_{EM}+V_{SAT2}+V_D$. This drop in the base voltage of transistor Q1 as rectifier 12 becomes conductive creates the hysteresis which provides the additional noise immunity in the present TTL circuit. Transistor Q1 turns off as its base-to-emitter voltage drops way below $1V_{BE}$. Voltage $V_X$ continues to rise up to high value $V_1$.

Because the base voltage for transistor Q1 drops to $V_{EM}+V_{SAT2}+V_D$, its base-collector junction does not become conductively forward biased so as to transmit current from the R1 source to the base of transistor Q2. The current needed to turn on transistor Q2 must be supplied by an independent current source which is the R3 source here.

When voltage $V_X$ is brought back down to $V_0$, transistor Q2 remains on until voltage $V_X$ drops to $V_{EM}+V_{SAT2}+V_D-V_{BE}$ since the base voltage for transistor Q1 is $1V_{BE}$ higher. At this point, transistor Q1 turns back on, causing transistor Q2 to turn back off as shown at point 16 in FIG. 3. The threshold value $V_{TF}$ at which transistor Q2 turns off is then $V_{EM}+V_{SAT2}+V_D-V_{BE}$. Voltage $V_Y$ returns to its "1" level, causing rectifier 12 to turn off.

Voltage $V_{TR}$ exceeds voltage $V_{TF}$ by $2V_{BE}-V_D-V_{SAT1}-V_{SAT2}$. The high-level falling input noise margin $V_1-V_{TR}$ then exceeds the high-level rising input noise margin $V_1-V_{TF}$ by the same amount. The complement of this exists for the low-level rising and falling input noise margins.

In the general case, transistors Q1 and Q2 are necessarily of the same polarity but may be either PNP devices or NPN devices. In this situation, the general relationship is that the absolute value of the difference between $V_{TR}$ and $V_E$ as transistor Q2 turns on exceed the absolute value of the difference between $V_{TF}$ and $V_E$ as transistor Q2 turns off. The difference between these two absolute values is then $2V_{BE}-V_D-V_{SAT1}-V_{SAT2}$ which is positive in the case of NPN devices where $V_{BE}$ is positive and which is negative in the case of PNP devices where $V_{BE}$ is negative.

Figure 4:
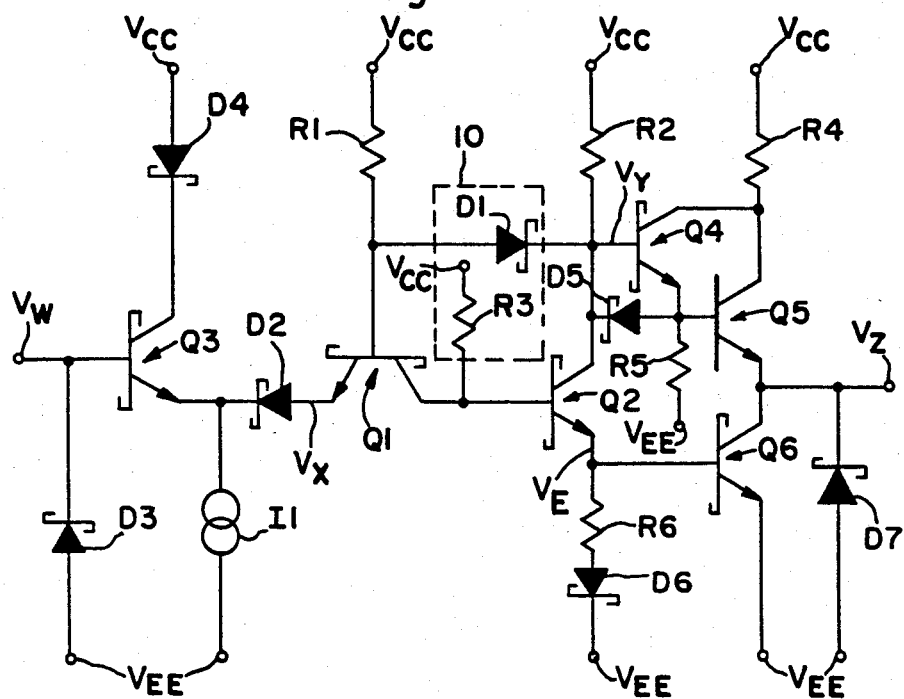
FIG. 4 is a circuit diagram of a transistor-input buffer gate employing the circuit of FIG. 2.

Turning to FIG. 4, it depicts a transistor-input TTL inverting buffer gate employing the TTL circuit of FIG. 12. In hysteresis circuit 10 of this buffer gate, rectifier 2 is a Schottky diode D1. In this case, voltage $V_D$ is $1V_S$ where $V_S$ is the standard Schottky diode-drop voltage for a Schottky diode when it is just conductively forward biased. For a typical Schottky diode, $V_S$ varies from 0.4 to 0.65 volt with temperature and is about 0.55 volt at room temperature.

In this buffer gate, transistors Q1 and Q2 are each Schottky clamped. For a Schottky-clamped NPN transistor, its saturation voltage $V_{SAT}$ equals $1V_{BE}-1V_S$. $V_{BE}$ varies with temperature from 0.6 to 1.0 volt for a typical NPN transistor and is about 0.75 volt at room temperature. $V_{SAT1}$ and $V_{SAT2}$ are each then about 0.2 volt. Accordingly, this buffer circuit has about 0.5 volt of additional noise protection due to the difference between threshold voltages $V_{TR}$ and $V_{TF}$.

On the input side of this buffer gate is a transistor-input section in which a logical input voltage $V_W$ is supplied to the base of an NPN transistor Q3 whose emitter is coupled through a Schottky diode D2 to the Q1 emitter. Diode D2 serves to prevent the Q1 emitter-base junction from breaking down due to positive surges in voltage $V_W$. The Q3 emitter is also coupled through a current source I1 to a source of a supply voltage $V_{EE}$. Source I1 is preferably configured as a conventional current mirror. A Schottky diode D3 connected between the Q3 base and the $V_{EE}$ supply clamps values of voltage $V_W$ below $V_{EE}$. A Schottky diode D4 connected between the $V_{CC}$ supply and the Q3 collector serves to prevent positive $V_W$ surges from supplying current to the $V_{CC}$ supply. Transistors Q3 and Q1 basically operate in the conventional emitter-coupled manner. Bringing voltage $V_W$ to a "1" turns on transistor Q3 so as to turn off transistor Q1, and vice versa. The logical value of $V_W$ is repeated in voltage $V_X$ at the Q1 emitter.

An output stage consisting of a high level driver and a low level driver is on the output side of the buffer gate. The high level driver contains a pair of NPN transistors Q4 and Q5 arranged in a Darlington configuration with their collectors coupled through a low-value resistor R4 to the $V_{CC}$ supply. Transistor Q4 whose base receives voltage $V_Y$ and whose emitter drives the Q5 base by way of a resistor R5 connected between the Q4 emitter and the $V_{EE}$ supply acts as a level shifter. Transistors Q4 and Q5 are both on when transistor Q2 is off, and vice versa. A logical output voltage $V_Z$ is taken from the Q5 emitter. As transistor Q2 turns off so as to provide voltage $V_Y$ at its "1" value, transistor Q5 turns on to actively pull voltage $V_Z$ up to "1" near $V_{CC}$. A Schottky diode D5 connected between the Q2 collector and the Q5 base aids in turning off the Darlington pair Q4 and Q5.

The low level driver contains an NPN transistor Q6 whose base is driven by the Q2 emitter through a resistor R6 and a Schottky diode D6 coupled between the Q2 emitter and the $V_{EE}$ supply. The Q6 collector is connected to the Q5 emitter to provide voltage $V_Z$. The Q6 emitter is connected to the $V_{EE}$ supply so that $V_{EM}$ is $1V_{BE}$ which occurs when transistor Q6 is turned on. Transistor Q6 is turned off when voltage $V_Y$ is at its "1" value. When transistor Q2 turns on to provide voltage $V_Y$ at its "0" value, transistor Q6 turns on to actively pull voltage $V_Z$ down to a "0" about $1V_{BE}-1V_S$ above $V_{EE}$. A Schottky diode D7 connected between the Q6 collector and the $V_{EE}$ supply clamps values of voltage $V_Z$ below $V_{EE}$.

Figure 5:
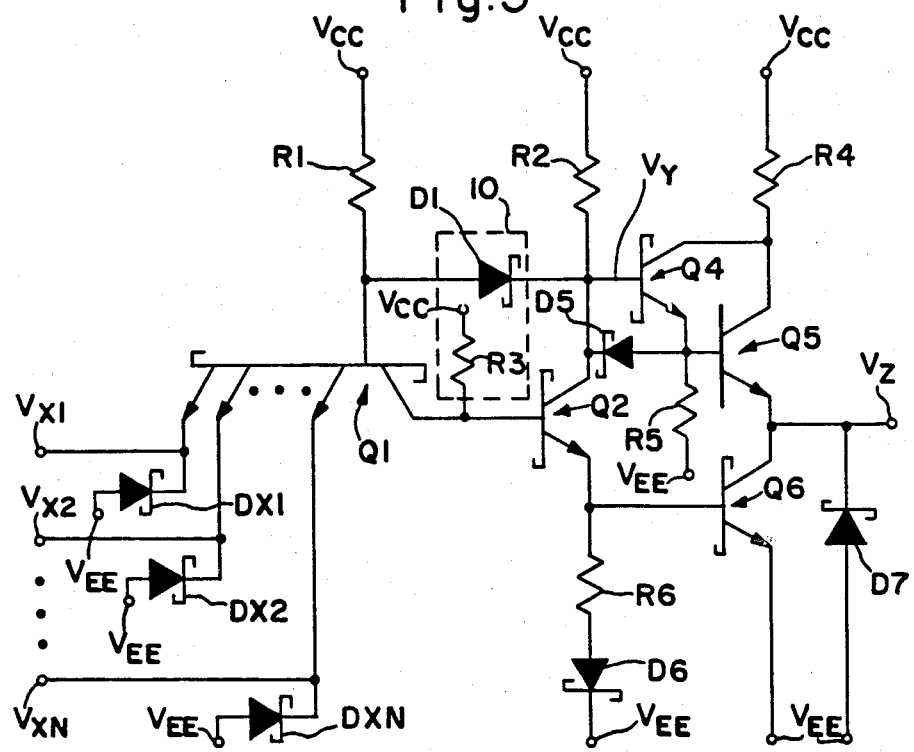
FIG. 5 is a circuit diagram of a NAND gate employing the circuit of FIG. 2.

FIG. 5 shows a TTL NAND gate employing the circuit of FIG. 2. In this NAND gate, rectifier 12 is again Schottky diode D1. Likewise, transistors Q1 and Q2 are again Schottky clamped so that the additional noise protection is about 0.5 volt.

In this NAND gate, transistor Q1 is a multi-emitter device having N emitters for respectively receiving N input voltages $V_{X1}-V_{XN}$. In addition, N Schottky diodes DX1, DX2, ... and DXN are connected respectively between the Q1 emitters on one hand and the $V_{EE}$ supply on the other hand.

An output stage provides voltage $V_Z$ on the output side of the NAND gate. This output stage contains a high level driver and a low level driver which are configured in the same manner as in the output stage of FIG. 4 and operate in the same way.

When one or more of voltage $V_{X1}-V_{XN}$ is at $V_0$, transistor Q1 is turned on which renders transistor Q2 nonconductive so that voltages $V_Y$ and $V_Z$ are each at "1". Transistor Q1 turns off as the last of voltages $V_{X1}-V_{XN}$ that were initially at $V_0$ is raised to or above $V_{TR}$. At this point, transistor Q2 turns on to bring voltages $V_Y$ and $V_Z$ down to their "0" values. The voltage at the Q1 base very quickly drops $2V_{BE}-V_D-V_{SAT1}-V_{SAT2}$ which is about 0.5 volt to produce the hysteresis in the manner described above. Transistor Q2 remains on until one of voltages $V_{X1}-V_{XN}$ is decreased to or below $V_{TF}$ which causes transistor Q2 to turn back off and transistor Q1 to turn back on.

In both the buffer gate of FIG. 4 and the NAND gate of FIG. 5, supply voltages $V_{CC}$ and $V_{EE}$ are 5.0 volts and 0 volt (ground reference), respectively. Logical levels $V_1$ and $V_0$ are nominally 3.0 volts and 0 volt, respectively. Resistors R1, R2, R3, R4, R5, and R6 are preferably about 25,000 ohms, 800 ohms, 7,500 ohms, 30 ohms, 5,000 ohms, and 500 ohms, respectively. In the buffer gate, source I1 sinks about 0.6 amperes.

Methods for manufacturing the various elements of the present TTL circuit including the gates shown in FIGS. 4 and 5 are well known in the semiconductor art. These elements are preferably manufactured in monolithic integrated circuit form according to conventional planar processing techniques using oxide isolation to separate active regions on a semiconductor wafer. The Schottky diodes are likewise formed according to standard Schottky processing techniques.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results except that most of the Schottky diodes would be deleted or formed in separate active semiconductor regions. Thus, various modifications, changes, and applications may be made by those skilled in the art without departing from the true scope and spirit of the invention as defined by the appended claims.

What is claimed is:

1. An electronic circuit which has: a first current source; a first bipolar transistor having an emitter for receiving an input signal, a base coupled to the first current source, and a collector; a second current source; and a like-polarity second bipolar transistor having an emitter at a control voltage, a base coupled to the collector of the first transistor, and a collector coupled to the second current source, wherein the second transistor turns on as the input signal moves in a first voltage rise/fall direction to a first threshold voltage; characterized by hysteresis means coupled to the base of the second transistor and coupled between its collector and the first current source for causing the second transistor to turn off as the input signal moves in a second voltage rise/fall direction opposite to the first rise/fall direction to a second threshold voltage where the absolute value of the difference between the first threshold voltage and the control voltage as the second transistor turns on exceeds the absolute value of the difference between the second threshold voltage and the control voltage as the second transistor turns off.

2. A circuit as in claim 1 characterized in that the hysteresis means comprises: rectifying means arranged in an opposing configuration to the base-emitter junction of the first transistor for transmitting current in a single current-flow direction between the first current source and the collector of the second transistor; and a third current source for supplying current to the base of the second transistor.

3. A circuit as in claim 2 characterized in that the rectifying means has a voltage drop $V_D$ greater than $0V_{BE}$ and less than $2V_{BE}$ between the first current source and the collector of the second transistor as the rectifying means is just conductively forward biased to transmit current, where $V_{BE}$ is the average base-to-emitter voltage of the transistors when their base-emitter junctions are just conductively forward biased.

4. A circuit as in claim 3 characterized in that the rectifying means comprises at least one diode.

5. A circuit as in claim 3 characterized in that the rectifying means comprises a Schottky diode.

6. A circuit as in claim 2 wherein each of the first and second current sources comprises a resistor coupled to a power supply, characterized in that the third current source comprises a resistor coupled to a power supply.

7. A circuit as in claim 6 characterized in that the power supplies are a single power supply.

8. A circuit as in claim 2 wherein the first transistor turns off as the input signal moves in the first rise/fall direction to the first threshold voltage, characterized in that the first transistor turns on as the input signal moves in the second rise/fall direction to the second threshold voltage.

9. A circuit as in claim 3 characterized in that the difference between the threshold voltages is approximately $2V_{BE} - V_D - V_{SAT1} - V_{SAT2}$, where $V_{SAT1}$ and $V_{SAT2}$ are the collector-to-emitter saturation voltages of the first and second transistors, respectively.

10. A circuit as in claim 1, 2, 3, 4, 5, 6, 7, 8, or 9 wherein each transistor is an NPN transistor and the second transistor turns on as the input signal rises to the first threshold voltage, characterized in that the second transistor turns off as the input signal drops to the second threshold voltage.

11. A circuit as in claim 2 characterized in that the collector of the second transistor provides a signal of opposite logical value to the input signal.

12. A circuit as in claim 2 characterized in that the first transistor has at least one additional emitter, each of which receives a corresponding input signal.

* * * * *